United States Patent
Freiman et al.

(10) Patent No.: US 11,894,091 B2
(45) Date of Patent: Feb. 6, 2024

(54) SYNCHRONIZED MEMORY REPAIR SYSTEM (SRS)

(71) Applicant: INTERNATIONAL BUSINESS MACHINES CORPORATION, Armonk, NY (US)

(72) Inventors: Yaron Freiman, Tel-Mond (IL); Noam Jungmann, Holon (IL); Tomer Abraham Cohen, Binyamina (IL); Elazar Kachir, Tel Aviv (IL); Hezi Shalom, Tel Aviv (IL)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 17/656,017

(22) Filed: Mar. 23, 2022

(65) Prior Publication Data

US 2023/0307080 A1    Sep. 28, 2023

(51) Int. Cl.
*G06F 11/00* (2006.01)
*G11C 29/44* (2006.01)
(Continued)

(52) U.S. Cl.
CPC ........ *G11C 29/4401* (2013.01); *G06F 11/073* (2013.01); *G06F 11/0793* (2013.01);
(Continued)

(58) Field of Classification Search
CPC . G11C 29/4401; G11C 11/418; G06F 11/073; G06F 11/0793; G06F 11/141; G06F 11/1666; G06F 11/2043
See application file for complete search history.

(56) References Cited

U.S. PATENT DOCUMENTS 5,327,380 A * 7/1994 Kersh, III ............ G11C 29/787
                                                      365/225.7
5,828,624 A * 10/1998 Baker .................. G11C 29/812
                                                      365/225.7
(Continued)

OTHER PUBLICATIONS

Anselmi, G. et al. (Oct. 2021) "IBM Power E1080—Technical Overview and Introduction." IBM Redbooks 172 pages. https://www.redbooks.ibm.com/abstracts/redp5649.html?Open. Retrieved from the internet on Mar. 22, 2022.

(Continued)

*Primary Examiner* — Christine T. Tu
(74) *Attorney, Agent, or Firm* — Richard B. Thomas

(57) ABSTRACT

A system, program product, and method for processing synchronized memory repairs. The method includes identifying a faulty memory row from a plurality of functioning memory rows in a memory array. The method also includes executing memory row repair operations directed toward the faulty memory row and identifying a repair row to operationally replace the faulty memory row. The method also includes creating a multiple hot state within a memory decoder. The memory decoder includes logic circuitry for executing operation of the plurality of functioning memory rows. The method further includes activating a wordline of the identified repair row through the multiple hot state, and executing one or more memory operations on the identified repair row though the memory decoder. Accordingly, the embodiments disclosed herein facilitate synchronization of the repair row and functioning memory rows within the memory array, as well as any associated peripheral signals.

20 Claims, 5 Drawing Sheets

(51) Int. Cl.
  *G06F 11/16* (2006.01)
  *G06F 11/14* (2006.01)
  *G06F 11/20* (2006.01)
  *G06F 11/07* (2006.01)
  *G11C 11/418* (2006.01)

(52) U.S. Cl.
  CPC ........ *G06F 11/141* (2013.01); *G06F 11/1666* (2013.01); *G06F 11/2043* (2013.01); *G11C 11/418* (2013.01)

(56) References Cited

U.S. PATENT DOCUMENTS

| | | | |
|---|---|---|---|
| 6,445,628 | B1 | 9/2002 | Pereira |
| 6,734,811 | B1 | 5/2004 | Cornelius |
| 2008/0065929 | A1 | 3/2008 | Nadeau-Dostie |
| 2008/0178053 | A1 | 7/2008 | Gorman |
| 2014/0056082 | A1 | 2/2014 | Park |
| 2016/0099079 | A1* | 4/2016 | Park ................ G11C 29/844 365/96 |
| 2019/0264629 | A1 | 8/2019 | Morzano |
| 2020/0335175 | A1 | 10/2020 | Wieduwilt |

OTHER PUBLICATIONS

Jin-Fu Li, "Memory Built-in Self-Repair," Advanced Reliable Systems (ARES) Lab, Department of Electrical Engineering National Central University, Jhongli Taiwan, http://www.ee.ncu.edu.tw/~jfli/memtest/lecture/ch07.pdf. Retrieved from the internet on Feb. 9, 2022.

Ponedal, S. (Sep. 8, 2021). "IBM unveils new generation of IBM Power servers for frictionless, scalable hybrid cloud." https://newsroom.ibm.com/2021-09-08-IBM-unveils-new-generation-of-IBM-Power-servers-for-frictionless,-scalable-hybrid-cloud. Retrieved from the internet on 22-Mar. 2022.

Sravani, A & Satyam, Mandavilli. (2010). Built-in Self Repair for SRAM Array using Redundancy. https://www.researchgate.net/publication/228884686_Built-in_Self_Repair_for_SRAM_Array_using_Redundancy.

* cited by examiner

SYNCHRONIZED MEMORY REPAIR SYSTEM (SRS)

BACKGROUND

The present disclosure relates to synchronized memory repair systems (SRSs), and, more specifically, to an integrated memory row decoder with both original memory row logic and memory row repair logic embedded therein.

Many known static random-access memory (SRAM) arrays are typically used for cache and internal registers of a central processing unit (CPU) and are physically located on the associated chips. In at least some known modern CPUs, as the CPUs processing capabilities increase, the SRAM devices occupy ever-enlarging chip areas and have become the focus of technological scaling efforts. Individual SRAM rows are known to experience failure, and physical troubleshooting and repairs require removal of the chip from service, followed by intricate actions, all of which are not practical. Therefore, many known SRAM arrays use one or more of spare rows in the memory array, a built-in row repair system, and a process configured to automatically detect a row failure, remove the failed row from service, and place the spare row in service, all typically transparent to the user. Synchronization of the repair system, the memory array, and the peripheral signals is one factor to consider subsequent to execution of the repair process.

SUMMARY

A system, a computer program product, and method are provided for synchronized memory repair.

In one aspect, a computer system is provided for synchronized memory repairs. The system includes a memory array that includes a plurality of memory rows that include a plurality of functioning memory rows, at least one faulty memory row, and a plurality of memory repair rows. The system also includes a plurality of wordlines. Each wordline of the plurality of wordlines is communicatively and operably coupled to one memory row of the plurality of memory rows. The system further includes an integrated memory decoder communicatively and operably coupled to the memory array. The integrated memory decoder includes logic circuitry configured to execute operation of the plurality of functioning memory rows. The integrated memory decoder is further configured to execute memory row repair operations directed toward the identified faulty memory row. Such operations include identifying a memory repair row from the plurality of memory repair rows to operationally replace the identified faulty memory row, creating a multiple hot state within the integrated memory decoder, activating the wordline of the identified memory repair row through the multiple hot state, and executing one or more memory operations on the identified memory repair row though the integrated memory decoder.

In another aspect, a computer program product embodied on at least one computer readable storage medium having computer executable instructions for synchronized memory repair is provided. The computer executable instructions when executed cause one or more computing devices to identify a faulty memory row in a memory array. The memory array also includes a plurality of functioning memory rows. The computer executable instructions when executed also cause the one or more computing devices to identify a faulty memory row in a memory array, where the memory array also includes a plurality of functioning memory rows. The computer executable instructions when executed further cause the one or more computing devices to execute memory row repair operations directed toward the identified faulty memory row. The computer executable instructions when executed also cause the one or more computing devices to identify a repair row to operationally replace the identified faulty memory row and create a multiple hot state within a memory decoder. The memory decoder includes logic circuitry for executing operation of the plurality of functioning memory rows. The computer executable instructions when executed also cause the one or more computing devices to activate a wordline of the identified repair, row through the multiple hot state, and execute one or more memory operations on the identified repair row though the memory decoder.

In yet another aspect, a computer-implemented method is provided for synchronized memory repair. The method includes identifying a faulty memory row in a memory array. The memory array also includes a plurality of functioning memory rows. The method also includes executing memory row repair operations directed toward the identified faulty memory row. The method further includes identifying a repair row to operationally replace the identified faulty memory row. The method also includes creating a multiple hot state within a memory decoder. The memory decoder includes logic circuitry for executing operation of the plurality of functioning memory rows. The method further includes activating a wordline of the identified repair row through the multiple hot state, and executing one or more memory operations on the identified repair row though the memory decoder.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1:
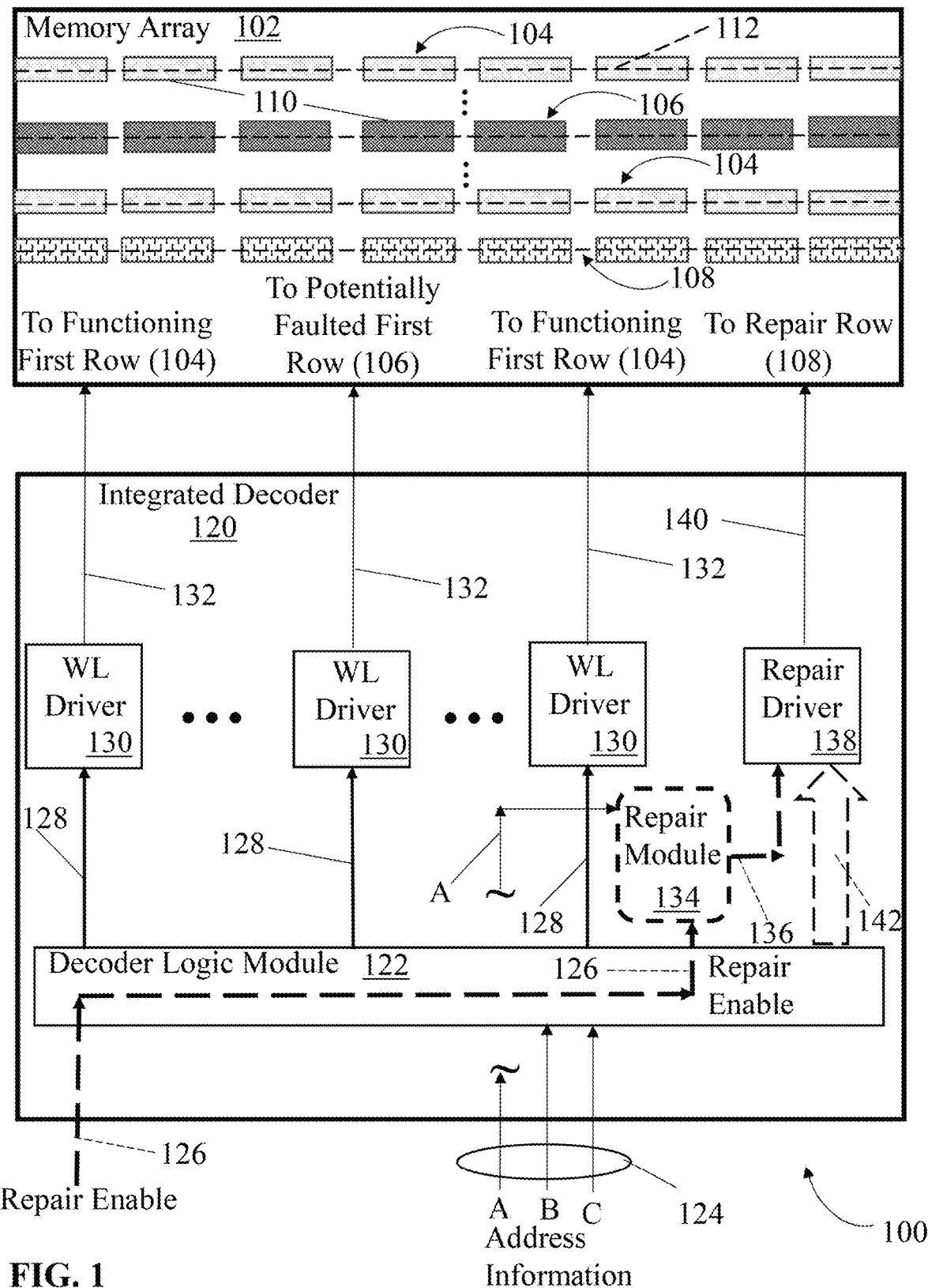
FIG. 1 is a block schematic diagram illustrating a synchronized memory repair system, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to executing synchronized memory repairs. While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following detailed description of the embodiments of the apparatus, system, method, and computer program product of the present embodiments, as presented in the Figures, is not intended to limit the scope of the embodiments, as claimed, but is merely representative of selected embodiments. In addition, it will be appreciated that, although specific embodiments have been described herein for purposes of illustration, various modifications may be made without departing from the spirit and scope of the embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Many known static random-access memory (SRAM) devices include one or more arrays of memory cells. Such SRAM devices are typically used for cache and internal registers of a central processing unit (CPU) and are physically located on the associated chips. In at least some known modern CPUs, as the CPUs processing capabilities increase, the SRAM devices occupy an ever-enlarging area on the respective chips and have become the focus of technological scaling efforts to manage the percentage of the chip area occupied by the memory blocks. Each of the memory arrays includes one or more rows of the aforementioned memory cells. In some embodiments, an array may be quite large, e.g., and without limitation, 100,000 to 500,000 memory cells in each array, and there may be thousands of arrays in a memory device. Individual SRAM cells are known to occasionally experience a fault and physical troubleshooting and repairs require removal of the chip from service, followed by intricate actions, all of which are not practical. Therefore, many known SRAM arrays include one or more spare rows in the memory array, a built-in row repair system, and a process configured to automatically detect a row with one or more potential memory cell faults, remove the row with the faulty cell from service, and place one of the spare rows in service, all typically executed transparently to the user and the read-write operations of the memory array.

In general, SRAM arrays include the memory cells configured to define a matrix of memory rows and columns. Each memory row is operably and communicatively coupled to a dedicated wordline (sometimes written in the art as "word line") that is configured to control the read-write operations with respect to each individual memory cell in the respective memory row through the addresses associated with the cell's row and column. In addition, each memory cell is operably and communicatively coupled to other operational signal conduits for enabling and controlling the read-write operations, clocking, etc., where all signal receipts and transmissions associated with each memory cell are synchronized for efficient and effective operation of the memory rows. The memory rows that were initially placed into service are referred to herein as the first rows. In addition to the first rows, the arrays include second, or spare rows that are reserved for effecting automated memory repairs, where these second rows also have individual wordlines and other operational signal conduits coupled thereto. The second memory rows are memory repair rows, referred to herein as repair rows.

Moreover, each memory array is operably and communicatively coupled to one or more decoders, i.e., memory row wordline decoders (herein memory decoders) that facilitate operation of the wordlines though the aforementioned addresses. In addition to the repair wordlines and respective operational signal conduits for the repair rows, the built-in row repair systems for SRAM require additional circuits that include, without limitation, repair wordline decoders (herein repair decoders). In some embodiments, each repair row includes one or more repair decoders that exacerbate the device-crowding on the chip. In some embodiments, a single dedicated repair decoder is used for each respective repair row. In addition, the repair decoders are typically smaller than the memory decoder, e.g., and without limitation, the memory decoder is fixed at 8 inputs by 256 outputs ($2^8$) and the repair decoder is fixed at 2 inputs by 4 outputs ($2^2$). Therefore, the repair decoders are typically lightly loaded as compared to the memory decoders. In the event of a notification of a cell failure, the associated wordline is removed from service, or in some embodiments, skipped, thereby operationally isolating the respective first row, and the repair decoder for a repair row is activated, thereby placing the respective repair row into service.

Moreover, the integrated operation of the memory decoder and the recently activated repair decoder do not distinguish between a cell in a repair row and a cell in the first row. The memory decoders for the memory array will process the respective inputs to outputs at the nominal processing speed; however, the recently activated repair decoder will execute a smaller number of similar operations more quickly, substantially due to the parallel repair circuit defining a much different logic cone than the primary wordline (WL) decoder circuit. As used herein, a logic cone refers to a combinational circuit required to determine signal logic, which is represented by a Boolean expression. Therefore, the disparity in the loading between the memory decoder and the repair decoder may cause the repair decoder to negatively affect the synchronization of the repair row with the rest of the memory array, which may impact the chip yield. Synchronization of the repair system, the memory array, and the peripheral signals is one factor to consider subsequent to execution of the repair process. Accordingly, the use of stand-alone repair decoders may deleteriously affect the reliability of the memory block in the event of one or more row repair operations.

Some known solutions to the synchronization issues include mechanisms to slow down the transmission of the signals from the relatively lightly-loaded, recently activated, repair decoder to the repair wordlines as compared to the transmission from the primary WL decoder to the functional wordlines. Such mechanisms include installation of hardware delay features and/or the addition of "dummy loads" either in the repair decoder or along the transmission conduits from the repair decoder to the repair row wordline. The hardware delay mechanisms typically do not generate the exact delays necessary to achieve the desired synchronization due to the varying circuit conditions, including different voltages, etc. Therefore, the hardware delay mechanisms do not always demonstrate the ability to maintain the necessary tracking with actual conditions. Similarly, the dummy loads are configured to mimic the loads associated with the primary WL decoder and the functional wordlines. However, as the load on the primary WL decoder and the functional wordlines varies, and the necessary tracking between the repair row circuits and the functional row circuits is difficult to obtain and maintain. In addition, both solutions use additional silicon area and draw additional electrical power, both resources that would likely be better used for other features.

In general, a firm rule of decoder design and employment is that no more than one output of a related set of semiconductor logic devices within the decoder will have a "high" output (i.e., a value of "1") in contrast to the remainder of the possible outputs having a "low" value (i.e., a value of "0"). Such decoders are sometimes referred to as "1 hot decoders" and "one hot decoders" to emphasize that only one output will be "hot" (i.e., high, or 1). Therefore, for a 256-output decoder, for example, one output will have a value of 1 while the other 255 output values will be 0.

Referring to FIG. 1, a block schematic diagram is presented illustrating a computer system, i.e., an automatic synchronized memory repair system (SRS) 100 (herein referred to as "the SRS system 100") that is configured to facilitate synchronized operation between a first row and a repair row of memory. The SRS system 100 includes a memory array 102 that includes a plurality of functioning first rows 104, a potentially faulted first row 106, and a repair row 108. Each of the rows includes a plurality of cells 110 (only two labeled for clarity) and a dedicated wordline 112 (only one labeled for clarity).

In some embodiments, the SRS system 100 includes an integrated memory decoder 120 (herein referred to as the integrated decoder 120) that is communicatively and operatively coupled to the memory array 102. The integrated decoder 120 is any decoder that enables operation of the SRS system 100 as described herein, including, without limitation, a 2 row, 4 row, 8 row, 16 row, 32 row, 64 row, 128 row, and 256 row decoder. The integrated decoder 120 is configured to execute all of the functions typically associated with a memory row decoder to facilitate operation of the memory array 102 through the wordlines 112 as previously described herein. Therefore, the integrated decoder 120 includes a memory decoder logic module 122 to execute such functions. The memory first decoder logic module 122 is configured to receive address information 124 associated with the associated read-write operations. In the present embodiment, the address information includes three address information input signals A, B, and C, where the value of 3 inputs is non-limiting. As will be discussed further with respect to FIGS. 1 and 2, the three inputs will generate eight outputs, thereby defining the integrated decoder 120 as a 3-to-8 decoder.

In addition, in some embodiments, the integrated decoder 120 includes at least a portion of those features typically assigned to a stand-alone repair decoder (as discussed further herein), thereby eliminating the need for such repair decoders. At least a portion of the structure of the integrated decoder 120 that enables such repair features is shown as dashed lines and dashed outlines in FIG. 1. Accordingly, the memory decoder logic module 122 is configured to receive a repair enable signal 126 (discussed further herein) that would have otherwise been transmitted to the repair decoder (not shown).

In one or more embodiments, the memory decoder logic module 122 is configured to process the address information 124 associated with the pending read-write operation and generate and transmit the respective wordline driver activation signals 128 to the respective wordline (WL) drivers 130, that in turn, and transmit the respective wordline read-write activation signals 132 to execute the appropriate read-write functions through the respective wordlines 112. The integrated decoder 120, in at least some embodiments, and excluding the row repair features (discussed below) is a 3-to-8 decoder, where only three of the outputted wordline read-write activation signals 132 are shown for clarity. Accordingly, the read-write operations for the functioning first rows 104 are executed as a result of the respective row logic (not shown) embedded for each row in the memory decoder logic module 122.

However, in some embodiments, the read-write activation signal 132 for the read-write operation is transmitted to the potentially faulted first row 106 with one or more potentially faulted memory cells 110. In such a case, the failure of the respective wordline 112 in the potentially faulted first row 106 to locate the affected cells 110 results in the generation of the repair enable signal 126. Therefore, the integrated decoder 120 includes a repair module 134, where the input signal A as well as the repair enable signal 126 are transmitted to the repair module 134. As discussed further herein, the repair module 134 includes the features necessary to generate and transmit a repair driver activation signal 136 (that is similar to the wordline driver activation signals 128) to a repair driver 138 that in turn generates and transmits a repair row wordline activation signal 140 (that is similar to the wordline read-write activation signals 132) to the wordline 112 of the repair row 108. In addition, in contrast to a stand-alone repair decoder, the operation of the wordlines 112 in the repair rows 108 is driven through the existing logic in the memory decoder logic module 122 as shown by read-write operation signal 142 generated by, and transmitted from, the memory decoder logic module 122. The repair module 134 and the memory decoder logic module 122 are discussed further with respect to FIG. 2. Also, as will be discussed further with respect to FIG. 2, the configuration of the integrated decoder 120 is reconfigured as a 3-to-9 decoder due to the addition of the repair row wordline activation signal 140 using the same circuitry in the decoder logic module 122 as that used to generate the eight wordline read-write activation signals 132.

Figure 2:
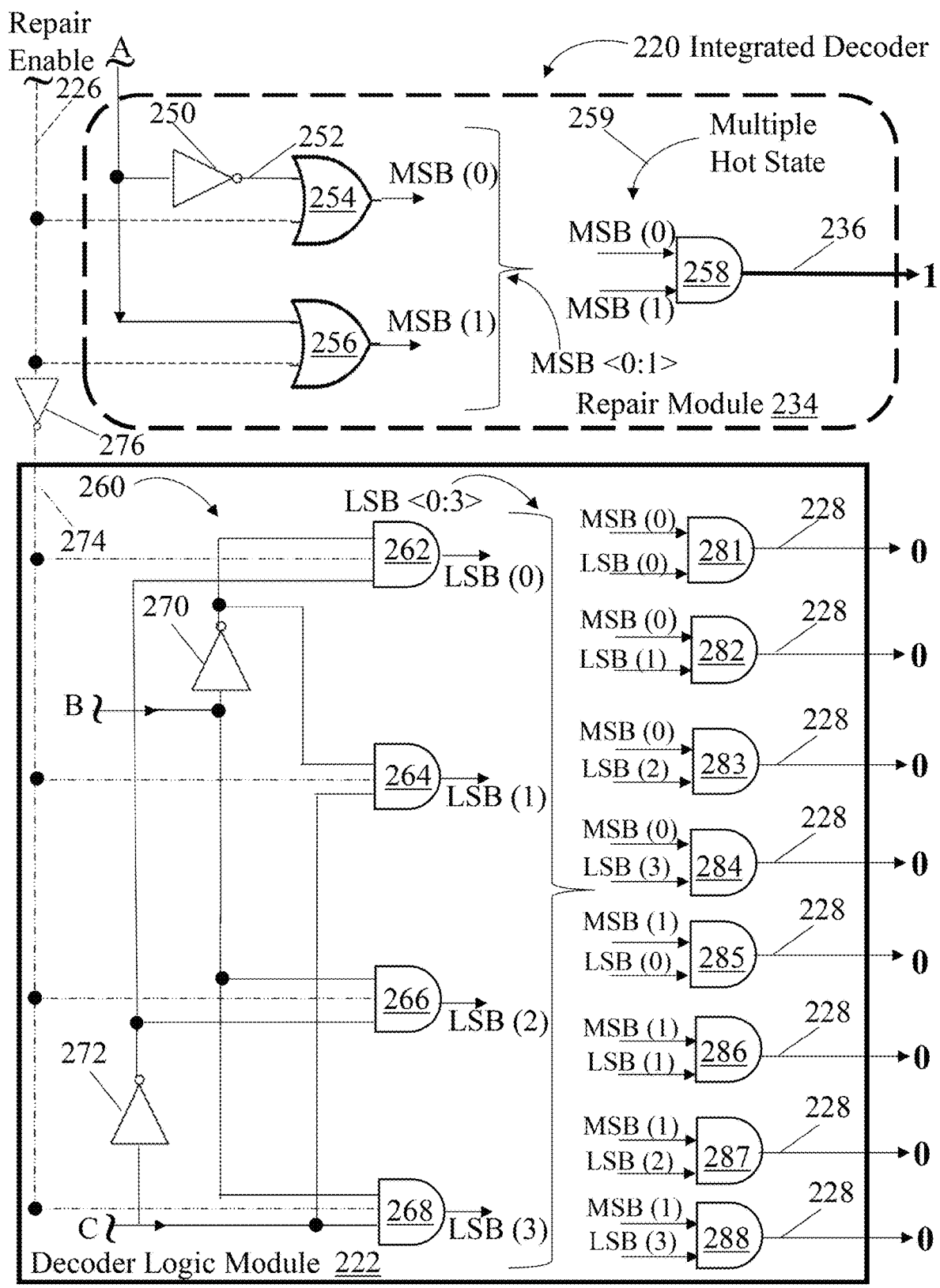
FIG. 2 is a block schematic diagram illustrating a portion of an integrated decoder, in accordance with some embodiments of the present disclosure.

Referring to FIG. 2, a block schematic diagram is presented illustrating a portion of the integrated decoder 220 (shown as 120 in FIG. 1), in accordance with some embodiments of the present disclosure. Specifically, FIG. 2 illustrates in more detail the repair module 234 (shown as 134 in FIG. 1) and the memory decoder logic module 222 (shown as 122 in FIG. 1) that are embedded in the integrated decoder 220. The repair module 234 is configured to receive the address information input signal A (herein the input signal A) and the repair enable signal 226 (shown as 126 in FIG. 1).

In at least some embodiments, the repair module 234 includes a MSB inverter 250. The MSB inverter 250 is configured to receive the address information input signal A and invert the input signal A. Therefore, when the input signal A is "high" (i.e., "1"), an output 252 of the MSB inverter 250 is "low" (i.e., "0"), and when the input signal A is 0, the output 252 is 1.

In one or more embodiments, the repair module 234 also includes a first MSB OR gate 254 that is configured to receive the inverted input signal A, i.e., output 252 and the repair enable signal 226 (shown as 126 in FIG. 1), and generate a most significant bit (MSB) (0) signal. Similarly, the repair module 234 includes a second MSB OR gate 256 that is configured to receive the non-inverted input signal A and the repair enable signal 226), and generate a MSB (1) signal.

In some embodiments, and in operation, when the repair enable signal is low (0), the MSB (0) and MSB (1) signals will be either 0 or 1 subject to the value of the input signal A. For those instances where the input signal A is 0, the inverter output 252 is 1, and the MSB (0) signal is 1. For those instances where the input signal A is 1, the inverter output 252 is 0, and the MSB (0) signal has a value of 0. Similarly, for those instances where the input signal A is 0, the MSB (1) signal is 0, and for those instances where the input signal A is 1, the MSB (1) signal has a value of 1. For those instances where the repair enable signal is high (1) (indicative of a repair operation being called), both MSB (0) and MSB (1) have a value of 1.

In at least some embodiments, the repair module 234 further includes an AND gate 258 that is configured to receive both the MSB (0) and MSB (1) signals from the first MSB OR gate 254 and the second MSB OR gate 256, respectively. The AND gate 258 is configured to generate and transmit the repair driver activation signal 236 (shown as 136 in FIG. 1). In operation, when the repair enable signal 226 has a value of 0, regardless of the value of the input signal A, the output of the AND gate 258, i.e., the repair driver activation signal 236, has a value of 0 and no repair action is taken. Specifically, if the value of the input signal A is 0 or 1, the combined outputs of MSB (0) and MSB (1) are either respectively 0 and 1, or respectively 1 and 0, thereby resulting in the repair driver activation signal 236 to the repair driver 138 to have a value of 0, and the activation signal 140 will not be transmitted to the wordline 112 of any of the repair rows 108.

In one or more embodiments, the repair enable signal 226 will switch from low (0) to high (1) as a result of the potentially faulted first memory row (106). When the repair enable signal 226 is 1, both MSB (0) and MSB (1) have values of 1, i.e., the combination of the generated MSB (0) and MSB (1) signals (written as MSB <0:1>) is 1 and 1. As a result, the AND gate 258 generates the repair driver activation signal 236 with a value of 1 (as shown in bold in FIG. 2) (sometimes referred to as "the select") that is transmitted to the repair driver 138, and the activation signal 140 is transmitted to the wordline 112 of one of the repair rows 108. The condition of two hot selects is referred to as a multiple hot state as indicted by the arrow 259. In some embodiments, the MSB (0) signal and the MSB (1) signal are used individually as discussed further below.

In some embodiments, the memory decoder logic module 222 is configured with a logic circuit 260 that includes four LSB AND gates 262, 264, 266, and 268 that generate signals of least significant bit (LSB) (0), LSB (1), LSB (2), and LSB (3), respectively. The number of 4 AND gates is a non-limiting value. Each of the LSB AND gates 262, 264, 266, and 268 is configured to receive both address information input signals B and C (herein input signal B and input signal C) (either inverted or not).

In some embodiments, the integrated decoder 220 includes a repair enable inverter 276 that is configured to invert the incoming repair enable signals 226 and generate and transmit inverted repair enable signals 274. In some embodiments, the repair enable inverter 276 is positioned in the decoder logic module 222. The LSB AND gates 262 through 268 are configured to receive the inverted repair enable signal 274. Therefore, when the repair enable signal 226 is 0 (indicative of no repair operations necessary), the four LSB AND gates 262 through 268 receive an inverted repair enable signal of 1, thereby facilitating operation of the integrated decoder 220 in operation of the functioning first rows 104 through the respective wordlines 112 when no row repair operations are pending. Similarly, during row repair operations through the exercising of the repair module 234, the inversion of the repair enable signal of 1 to the inverted repair signal 274 with a value of 0 precludes operation of the four LSB AND gates 262 through 268, thereby at least temporarily halting operation of the integrated decoder 220 in operation of the functioning first rows 104 through the respective wordlines 112 when there are row repair operations pending.

The separation of the integrated decoder 220 into the repair module 234 and the decoder logic module 222, including the repair enable inverter 276, preempts the possibility of the decoder logic module 222 generating a hot state, i.e., a select (discussed further below) while the repair module 234 is generating the multiple hot state 259.

In at least some embodiments, the logic circuit 260 of the decoder logic module 222 includes a first LSB inverter 270 and a second LSB inverter 272. The first LSB inverter 270 is configured to receive the input signal B and invert it for transmission to the LSB AND gates 262 and 264. Similarly, the second LSB inverter 272 is configured to receive the input signal C and invert it for transmission to the LSB AND gates 262 and 264. The non-inverted input signals B are transmitted directly to the LSB AND gates 266 and 268, and the non-inverted input signals C are transmitted directly to the LSB AND gates 262 and 264. Therefore, each of the LSB AND gates 262 through 268 is configured to generate the respective LSB (0) through LSB (3) output signals with a value of 1 when all three of the respective inputs have a value of 1.

In some embodiments, the logic circuit 260 includes another plurality of AND gates, i.e., AND gates 281 through 288. The AND gate 281 is configured to receive the MSB (0) signal from the MSB OR gate 254 in the repair module 234 and the LSB (0) signal from the LSB AND gate 262. Similarly, each of AND gates 282, 283, and 284 are configured to receive the MSB (0) signals, while each of the AND gates 285 through 288 is configured to receive the MSB (1) signal from the MSB OR gate 256. Furthermore, the AND gate 285 is configured to receive the LSB (0) signal. Moreover, the AND gates 282 and 286 are configured to receive the LSB (1) signals from the LSB AND gate 264, the AND gates 283 and 287 are configured to receive the LSB (2) signals from the LSB AND gate 266, and the AND gates 284 and 288 are configured to receive the LSB (3) signals from the LSB AND gate 268. Each of the AND gates 281 through 288 is configured to generate and transmit the respective wordline driver activation signals 228 (shown as 128 in FIG. 1) to the respective wordline (WL) drivers 130, that in turn, transmit the respective wordline read-write activation signals 132 to execute the appropriate read-write functions through the respective wordlines 112.

During normal operation, where the value of the repair enable signal 226 is 0, and the inverted repair enable signal 274 is 1, the logic circuit 260 generates pairs of signals from the eight possible combinations of MSB<0:1> and LSB <0:3>, where only one such combination can be the select, i.e., a value of 1 according to the rules described above, and all other combinations are 0. As shown in FIG. 2, the repair enable signal 226 is 1, and the four AND gates 262, 264, 266, and 268 are temporarily deactivated such that the only possible outputs from the logic circuit 260 are 0 (as shown in FIG. 2 as bolded). Accordingly, when the repair enable signal 226 is 1, the ability of the memory decoder logic module 222 to process the incoming address information for read-write operations of the functioning first rows 104 is temporarily halted such that the appropriate wordline 112 for the appropriate repair row 108 is activated for the faulted read-write operations associated with the respective wordline 112 for the respective potentially faulted row 106. Therefore, the configuration of the integrated decoder 220 as described herein facilitates generating a single hot state in either of the repair module 234 and the decoder logic module 222 and not both simultaneously such that the operation of the repair module 234 does not interfere with the operation of the decoder logic module 222 and vice versa. Accordingly, the potential for the integrated decoder 220 to generate more than one hot state for the nine possible outputs, i.e., the eight possible wordline driver activation signals 228 and the repair driver activation signal 236, is thereby precluded.

As previously described, in general, a firm rule of decoder design and employment is that no more than one output of a related set of semiconductor logic devices within the decoder will have a "high" output (i.e., a select with a value of "1") in contrast to the remainder of the possible outputs having a "low" value (i.e., a value of "0"). However, the integrated decoder 220 obviates that rule. Specifically, the integrated decoder 220 (which would otherwise be a 1 hot decoder) is forced through the repair module 234 to a 2 hot state (which, in normal operation, is prohibited) and this 2 hot state is used to drive the repair elements of the SRS system 100 as previously described. Accordingly, the previously discussed configuration and operation of the repair module 234 breaks the one hot state rule, such that the indication of a faulty row will enable two outputs (selects) of 1 which will be used to generate a combined output (select) of 1 to allow the memory row repair actions.

Therefore, in at least some embodiments, the structure of the integrated decoder 220 includes a modified structure, i.e., the basic decoder structure of the memory decoder logic module 222 and the repair module 234. The repair module 234 activates the repair driver 138 (shown in FIG. 1) through the repair driver activation signal 236, and the memory decoder logic module 222 is continued to be employed to use the existing logic infrastructure to execute the respective logic to activate the wordlines 112 on the repair rows 108. Therefore, as shown in FIG. 2, a previously 3 input-8 output decoder, with the addition of the memory decoder logic module 222, is expanded into a 3 input-9 output decoder, i.e., 8 wordline driver activation signals 228 and a repair driver activation signal 236.

Moreover, since the integrated decoder 220 has been configured to use multiple hot signals (where the two hot signals described herein is non-limiting) to activate the repair features, i.e., create a multiple hot state within a multiple hot decoder, the operation of the repair features is more balanced with respect to maintaining the synchronization of the repair rows 108 with the remainder of the memory array 102, including the functioning first rows 104.

In addition, the synchronization and alignment of the operation of the repair rows with respect to the peripheral signals in each individual process of the memory array 102, where such synchronization and alignment is substantially maintained through the use of the existing logic infrastructure, i.e., a logic cone that is substantially similar to the original logic cone through the use of the memory decoder logic module 222, including the same drivers, wire/conduit loads, established voltages, etc. Similarly, the activation signal 140 that is transmitted to the wordline 112 of one of the repair rows 108 is aligned and synchronized with the wordline read-write activation signals 132 to execute the appropriate read-write functions through the respective wordlines 112 of the functioning rows 104.

Figure 3A:
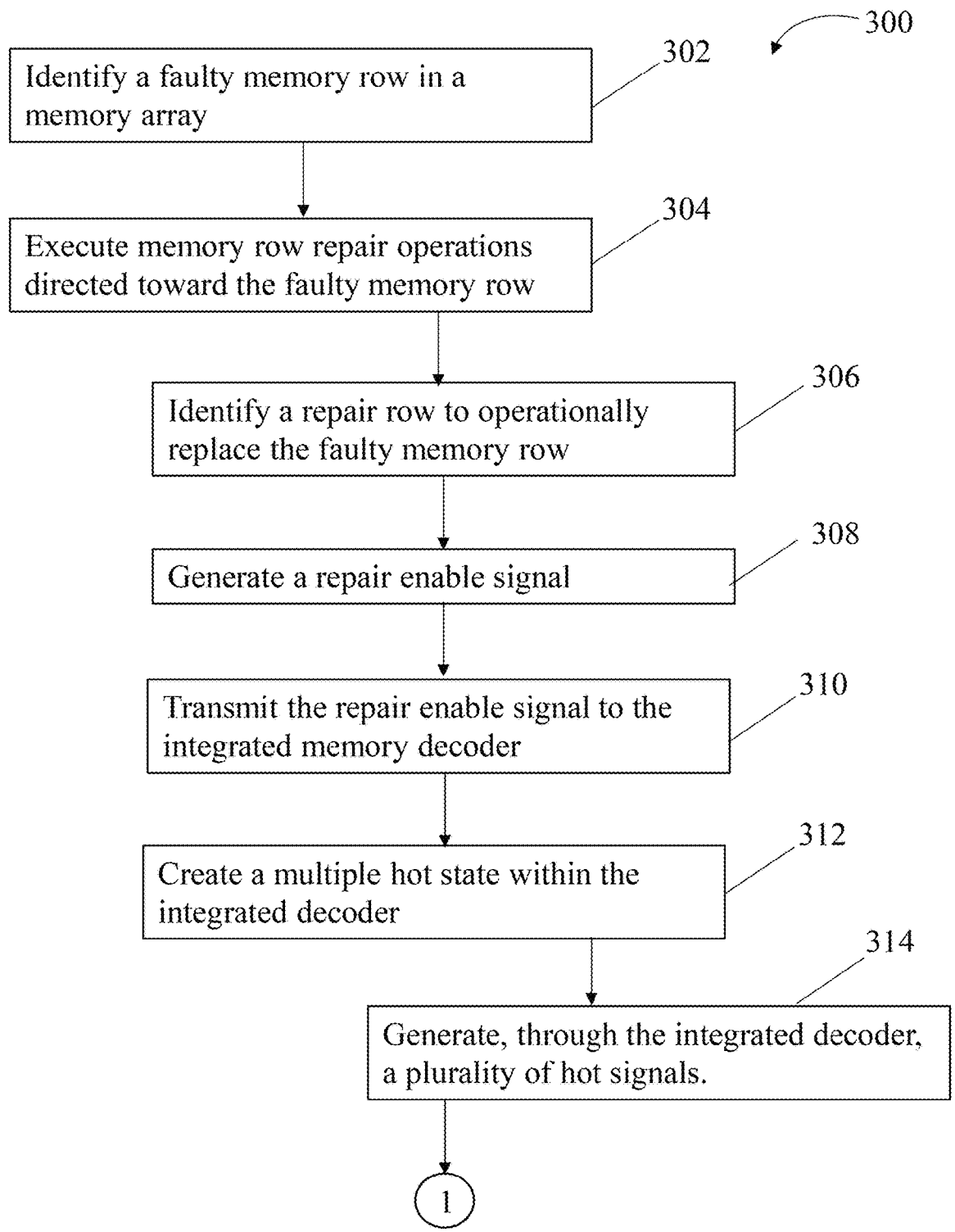
FIG. 3A is a flowchart illustrating a process for automatic operation of the synchronized memory repair system, in accordance with some embodiments of the present disclosure.

Referring to FIG. 3A, a flowchart is provided illustrating a process 300 for automatic operation of the synchronized memory repair system 100, in accordance with some embodiments of the present disclosure. Also referring to FIGS. 1 and 2, the process 300 includes identifying 302 the faulty first (memory) row 106 in the memory array 102. In at least some embodiments, the failure of the respective wordline 112 in the faulty first (memory) row 106 to locate the affected cells 110 results in the identification of the faulty first (memory) row 106 through mechanisms that are known in the art of memory fault detection and repair. In some embodiments, rather than an initial identification of a potentially faulty row, the present repair row is being used for repeated memory read and write operations. In such embodiments, continued identification 302 of the faulty memory row 106 is executed through mechanisms that include, without limitation, an address compare unit (not shown) that compares the new/current memory address with the faulty row memory address, where this information is stored in the repair enable signal 226. The process 300 also includes executing 304 memory row repair operations directed toward the faulty first (memory) row 106. The executing 304 the memory row repair operations step includes identifying 306 the repair row 108 to operationally replace the faulty first (memory) row 106. In some embodiments, such identifying 306 is repeatedly iterated in a manner similar to that discussed for the identifying step 302 as discussed above. The executing 304 the memory row repair operations also includes generating 308, subject to the identification 302 of the faulty first (memory) row 106, the repair enable signal 226 through the failure of the respective wordline 112 in the faulted first (memory) row 106 to locate the affected cells 110.

In some embodiments, the executing 304 the memory row repair operations step further includes transmitting 310 the repair enable signal 226 to the integrated decoder 220, where the repair module 234 creates 312 a multiple hot state 259 within the integrated decoder 220 through generating 314 the plurality of hot signals MSB (0) and MSB (1). The combination of both the first MSB OR gate 254 and the second MSB OR gate 256 generating 314 (and transmitting) the multiple hot signals with values of 1 for both MSB (0) and MSB (1), respectively, results in the multiple hot state 259, and in particular, a 2 hot state, for the integrated decoder 220. As previously described, creating a multiple hot state in the integrated decoder 220 would typically be prohibited. However, the integrated decoder 220 obviates that rule.

In one or more embodiments, for the design and fabrication of the chip on which the memory array 102 resides, the creation 312 of the multiple hot state 259 results in the elimination of the repair decoders from previous designs of the chip. In addition, positioning the logic circuit 260 for executing operation of the plurality of functioning memory rows 104 within the decoder logic module 222 that is resident in the integrated decoder 220, results in the decoder logic module 222 at least partially defining the integrated decoder 220 with a number N of inputs and $2^N$ outputs. Moreover, coupling the repair module 234 (also resident in the integrated decoder 220) to the decoder logic module 222, results in the repair module 234 creating 312 the multiple hot state 259, thereby extending the number of outputs of the integrated decoder 220 to $2^N+1$. For those embodiments that are configured to execute more than one repair action, i.e., include more than one repair module 234, the expression for extending the number of outputs of the integrated decoder 220 is $2^N+M$, where M is a variable representing the number of repair actions being executed at any one point in time. In some of those embodiments, the number of repair actions M will equal the number of available repair modules 234. In some embodiments, rather than duplicating the entirety of the repair module 234, the repair row selection is based on the existing logic in the decoder logic module 222, e.g., and without limitation, any two of LSB (0), LSB (1), LSB (2), and LSB (3). Therefore in such embodiments, only the AND gate 258 is duplicated to generate and transmit the repair driver activation signal 236.

Figure 3B:
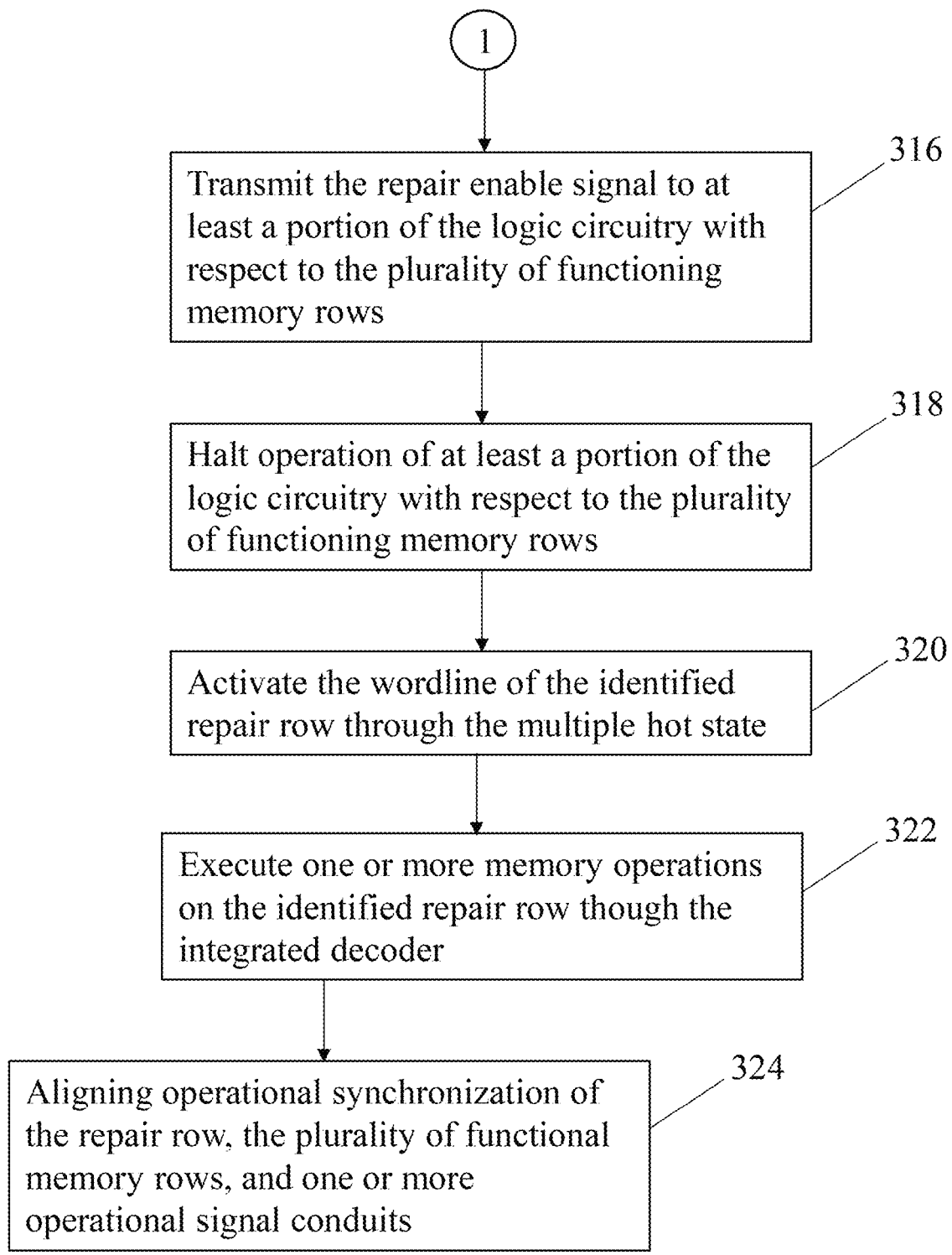
FIG. 3B is continuation of the flowchart shown in FIG. 3A, in accordance with some embodiments of the present disclosure.

Referring to FIG. 3B, a continuation of the flowchart shown in FIG. 3A is provided, in accordance with some embodiments of the present disclosure. Also referring to FIGS. 1, 2, and 3A, in at least some embodiments, in addition to the method steps 306 through 314, the executing 304 the memory row repair operations further includes transmitting 316 the repair enable signal 226 to at least a portion of the logic circuitry, i.e., the logic circuit 260, with respect to the plurality of the functioning memory rows 104, thereby halting 318 operation of at least a portion of the logic circuit 260.

In some embodiments, the executing 304 the memory row repair operations also includes activating 320 the wordline 112 of the identified repair row 108 through the multiple hot state 259 and executing 322 one or more memory operations on the identified repair row 108 though the integrated decoder 220. The process 300 further includes aligning 324 operational synchronization of the repair row 108, the plurality of functional memory rows 104, and one or more operational signal conduits (not shown) through using, for the repair row 108, a substantially identical logic path within the logic circuit 260 as that used for the plurality of functional memory rows 104.

The system, computer program product, and method as disclosed herein facilitate overcoming the disadvantages and limitations of known systems and methods for executing memory row repairs. Such disadvantages are overcome through generating a multiple hot state as described herein in contradiction of the "one hot rule," thereby eliminating a need for repair decoders. The embodiments disclosed herein include additional elements that integrate the processes described herein into a practical application that improves operation of memory systems. For example, removal of the repair decoders and eliminating the resulting challenge to signal synchronization in the memory systems through using the existing decoder logic circuitry results in maintaining the intended signal alignment, thereby removing a significant potential deficiency of the repair decoders. In addition, the embodiments described herein facilitate the memory array to automatically process adaptive processing loads, regardless of the ranges of voltages and any process variations, for all of the decoder operations. In addition, benefits of eliminating the repair decoders frees up physical silicon area on the associated chips as well as reducing the power draw for the memory repair systems. Accordingly, significant improvements to known memory repair systems are realized through the present disclosure.

Figure 4:
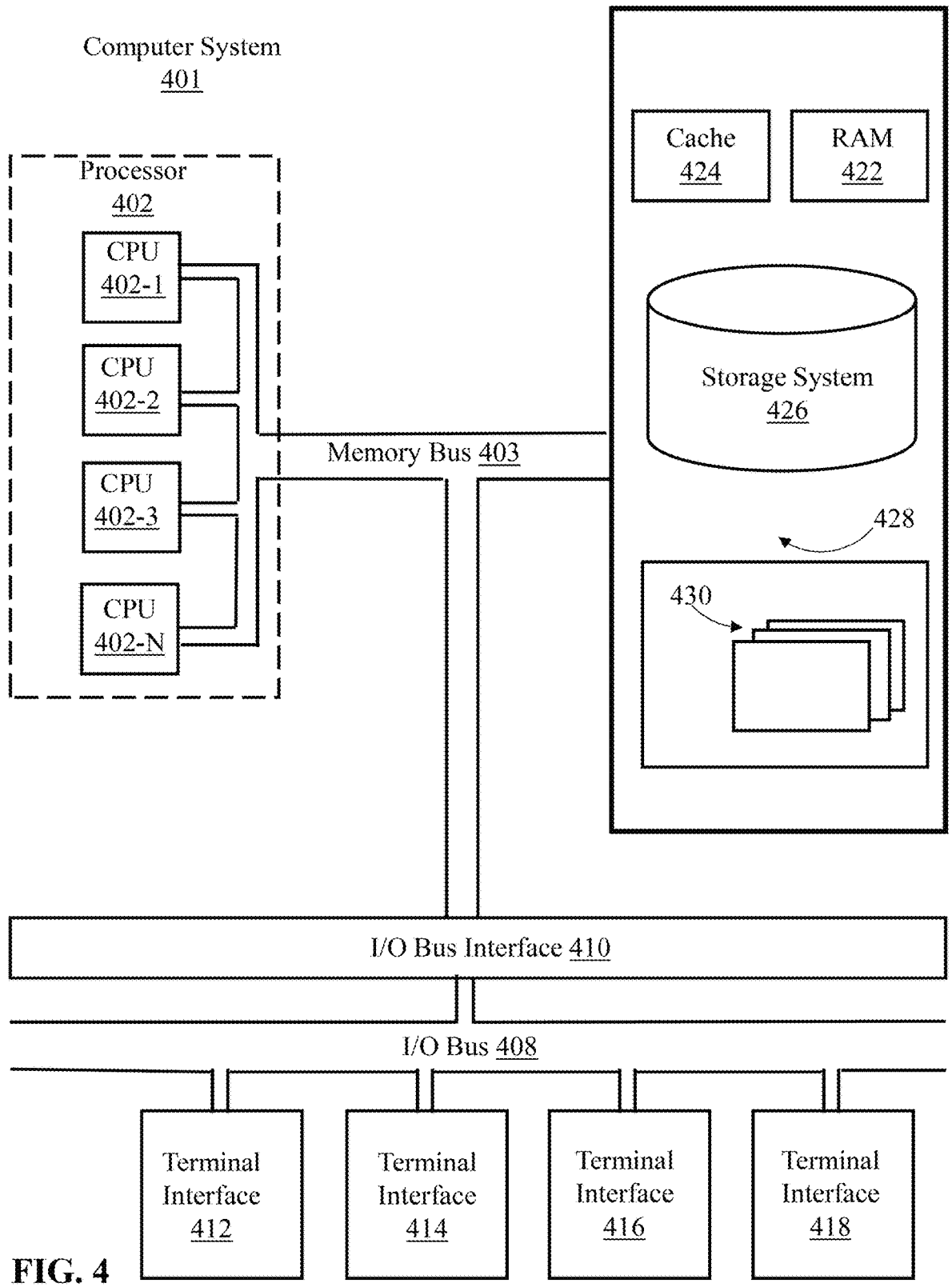
FIG. 4 is a block schematic diagram illustrating a computing system, in accordance with some embodiments of the present disclosure.

Referring now to FIG. 4, a block schematic diagram is provided illustrating a computing system 401 that may be used in implementing one or more of the methods, tools, and modules, and any related functions, described herein (e.g., using one or more processor circuits or computer processors of the computer), in accordance with some embodiments of the present disclosure. In some embodiments, the major components of the computer system 401 may comprise one or more CPUs 402, a memory subsystem 404, a terminal interface 412, a storage interface 416, an I/O (Input/Output) device interface 414, and a network interface 418, all of which may be communicatively coupled, directly or indirectly, for inter-component communication via a memory bus 403, an I/O bus 408, and an I/O bus interface unit 410.

The computer system 401 may contain one or more general-purpose programmable central processing units (CPUs) 402-1, 402-2, 402-3, 402-N, herein collectively referred to as the CPU 402. In some embodiments, the computer system 401 may contain multiple processors typical of a relatively large system; however, in other embodiments the computer system 401 may alternatively be a single CPU system. Each CPU 402 may execute instructions stored in the memory subsystem 404 and may include one or more levels of on-board cache.

System memory 404 may include computer system readable media in the form of volatile memory, such as random access memory (RAM) 422 or cache memory 424. Computer system 401 may further include other removable/non-removable, volatile/non-volatile computer system storage media. By way of example only, storage system 426 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 404 can include flash memory, e.g., a flash memory stick drive or a flash drive. Memory devices can be connected to memory bus 403 by one or more data media interfaces. The memory 404 may include at least one program product having a set (e.g., at least one) of program modules that are configured to carry out the functions of various embodiments.

Although the memory bus 403 is shown in FIG. 4 as a single bus structure providing a direct communication path among the CPUs 402, the memory subsystem 404, and the I/O bus interface 410, the memory bus 403 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 410 and the I/O bus 408 are shown as single respective units, the computer system 401 may, in some embodiments, contain multiple I/O bus interface units 410, multiple I/O buses 408, or both. Further, while multiple I/O interface units are shown, which separate the I/O bus 408 from various communications paths running to the various I/O devices, in other embodiments some or all of the I/O devices may be connected directly to one or more system I/O buses.

In some embodiments, the computer system 401 may be a multi-user mainframe computer system, a single-user system, or a server computer or similar device that has little or no direct user interface, but receives requests from other computer systems (clients). Further, in some embodiments, the computer system 401 may be implemented as a desktop computer, portable computer, laptop or notebook computer, tablet computer, pocket computer, telephone, smart phone, network switches or routers, or any other appropriate type of electronic device.

It is noted that FIG. 4 is intended to depict the representative major components of an exemplary computer system 401. In some embodiments, however, individual components may have greater or lesser complexity than as represented in FIG. 4, components other than or in addition to those shown in FIG. 4 may be present, and the number, type, and configuration of such components may vary.

One or more programs/utilities 428, each having at least one set of program modules 440 may be stored in memory 404. The programs/utilities 428 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 428 and/or program modules 440 generally perform the functions or methodologies of various embodiments.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system for processing synchronized memory repairs comprising:
    a memory array comprising:
        a plurality of memory rows, the plurality of memory rows comprising a plurality of functioning memory rows, at least one faulty memory row, and a plurality of memory repair rows; and
        a plurality of wordlines, wherein each wordline of the plurality of wordlines:
            is communicatively and operably coupled to one memory row of the plurality of memory rows; and
    an integrated memory decoder communicatively and operably coupled to the memory array, the integrated memory decoder comprising logic circuitry configured to execute operation of the plurality of functioning memory rows, the integrated memory decoder further configured to:
        execute memory row repair operations directed toward the faulty memory row, comprising:
            identifying a memory repair row from the plurality of memory repair rows to operationally replace the faulty memory row;
            creating a multiple hot state within the integrated memory decoder;
            activating a wordline of the identified memory repair row through the multiple hot state; and
            executing one or more memory operations on the identified memory repair row through the integrated memory decoder.

2. The system of claim 1, wherein:
    the memory array is further configured to generate a repair enable signal; and
    the integrated memory decoder is further configured to:
        receive the repair enable signal; and
        generate a plurality of hot signals, thereby create the multiple hot state.

3. The system of claim 2, wherein the integrated memory decoder is further configured to:
    halt operation of at least a portion of the logic circuitry with respect to the plurality of functioning memory rows.

4. The system of claim 2, wherein the integrated memory decoder is further configured to:
    transmit the repair enable signal to at least a portion of the logic circuitry with respect to the plurality of functioning memory rows.

5. The system of claim 1, wherein the integrated memory decoder is further configured to:
    eliminate one or more repair decoders.

6. The system of claim 1, wherein the computer system further comprises one or more operational signal conduits, the integrated memory decoder is further configured to:
    align operational synchronization of the memory repair row, the plurality of functional memory rows, and the one or more operational signal conduits comprising:
        use, for the memory repair row, a substantially identical logic path within the logic circuitry as that used for the plurality of functional memory rows.

7. The system of claim 1, wherein the integrated memory decoder further comprises:
    a decoder logic module, wherein the logic circuitry for executing the operation of the plurality of functioning memory rows is embedded within the decoder logic module, the decoder logic module at least partially defines the memory decoder with a number N of inputs and a number of $2^N$ outputs; and
    one or more repair modules communicatively and operably coupled to the decoder logic module, each of the one or more repair modules comprises logic circuitry for creating a respective multiple hot state, thereby extending the number of outputs of the memory decoder to $2^N+M$, where M represents a number of repair actions being executed through the one or more repair modules.

8. A computer program product embodied on at least one computer readable storage medium having computer executable instructions for processing synchronized memory repairs, that when executed cause one or more computing devices to:

identify a faulty memory row in a memory array, where the memory array also includes a plurality of functioning memory rows; and execute memory row repair operations directed toward the identified faulty memory row, comprising:

identifying a repair row to operationally replace the identified faulty memory row;

creating a multiple hot state within a memory decoder, wherein the memory decoder includes logic circuitry for executing operation of the plurality of functioning memory rows;

activating a wordline of the identified repair row through the multiple hot state; and executing one or more memory operations on the identified repair row through the memory decoder.

9. The computer program product of claim 8, further having computer executable instructions to:

generate, subject to the identifying the faulty memory row, a repair enable signal;

transmit the repair enable signal to the memory decoder; and generate, through the memory decoder, a plurality of hot signals.

10. The computer program product of claim 9, further having computer executable instructions to:

halt operation of at least a portion of the logic circuitry with respect to the plurality of functioning memory rows.

11. The computer program product of claim 9, further having computer executable instructions to:

transmit the repair enable signal to at least a portion of the logic circuitry with respect to the plurality of functioning memory rows.

12. The computer program product of claim 8, further having computer executable instructions to:

align operational synchronization of the repair row, the plurality of functional memory rows, and one or more operational signal conduits comprising:

use, for the repair row, a substantially identical logic path within the logic circuitry as that used for the plurality of functional memory rows.

13. The computer program product of claim 8, further having computer executable instructions to:

at least partially define the memory decoder with a number N of inputs and a number of $2^N$ outputs; and extend the number of outputs of the memory decoder to $2^N+M$, where M represents a number of repair actions executing.

14. A computer-implemented method for processing synchronized memory repairs comprising:

identifying a faulty memory row in a memory array, wherein the memory array also includes a plurality of functioning memory rows; and executing memory row repair operations directed toward the identified faulty memory row, comprising:

identifying a repair row to operationally replace the identified faulty memory row;

creating a multiple hot state within a memory decoder, wherein the memory decoder includes logic circuitry for executing operation of the plurality of functioning memory rows;

activating a wordline of the identified repair row through the multiple hot state; and executing one or more memory operations on the identified repair row through the memory decoder.

15. The method of claim 14, wherein the creating the multiple hot state comprises:

generating, subject to the identifying the faulty memory row, a repair enable signal;

transmitting the repair enable signal to the memory decoder; and generating, through the memory decoder, a plurality of hot signals.

16. The method of claim 15, wherein the creating the multiple hot state further comprises:

halting operation of at least a portion of the logic circuitry with respect to the plurality of functioning memory rows.

17. The method of claim 15, wherein the halting operation of the at least a portion of the logic circuitry comprises:

transmitting the repair enable signal to at least a portion of the logic circuitry with respect to the plurality of functioning memory rows.

18. The method of claim 14, wherein the memory array and the memory decoder reside on a chip, the method further comprising:

eliminating one or more repair decoders from the chip.

19. The method of claim 14, further comprising:

aligning operational synchronization of the repair row, the plurality of functional memory rows, and one or more operational signal conduits comprising:

using, for the repair row, a substantially identical logic path within the logic circuitry as that used for the plurality of functional memory rows.

20. The method of claim 14, further comprising:

positioning the logic circuitry for executing operation of the plurality of functioning memory rows within a decoder logic module, wherein the decoder logic module at least partially defines the memory decoder with a number N of inputs and a number of $2^N$ outputs; and coupling one or more repair modules to the decoder logic module, wherein each of the one or more repair modules resides in the memory decoder, each of the one or more repair modules includes logic circuitry for creating a respective multiple hot state, thereby extending the number of outputs of the memory decoder to $2^N+M$, where M represents a number of repair actions being executed through the one or more repair modules.

* * * * *